United States Patent
Rupp et al.

(10) Patent No.: US 6,740,167 B1
(45) Date of Patent: May 25, 2004

(54) DEVICE FOR MOUNTING A SUBSTRATE AND METHOD FOR PRODUCING AN INSERT FOR A SUSCEPTOR

(75) Inventors: Roland Rupp, Lauf (DE); Arno Wiedenhofer, Regensburg (DE)

(73) Assignee: SICED Electronics Development GmbH & Co., KG, Erlangen (DE)

( * ) Notice: Subject to any disclaimer, the term of this patent is extended or adjusted under 35 U.S.C. 154(b) by 314 days.

(21) Appl. No.: 09/630,154

(22) Filed: Jul. 31, 2000

Related U.S. Application Data

(63) Continuation of application No. PCT/DE99/00097, filed on Jan. 18, 1999.

(30) Foreign Application Priority Data

Jan. 29, 1998 (DE) .......................... 198 03 423

(51) Int. Cl.⁷ .......................... H01L 21/00; C23C 16/00
(52) U.S. Cl. .................. 118/728; 118/725; 118/715; 156/345.51; 156/345.52
(58) Field of Search .................. 118/728, 725; 156/345.51, 345.52

(56) References Cited

U.S. PATENT DOCUMENTS

| | | | | |
|---|---|---|---|---|
| 4,123,571 A | * | 10/1978 | Balog et al. | 427/249.15 |
| 4,439,232 A | * | 3/1984 | Ghandehari | 75/10.14 |
| 4,499,354 A | * | 2/1985 | Hill et al. | 219/634 |
| 4,507,189 A | * | 3/1985 | Doi et al. | 207/192.35 |
| 4,767,666 A | * | 8/1988 | Bunshah et al. | 428/334 |
| 4,793,975 A | * | 12/1988 | Drage | 156/345.47 |
| 5,121,705 A | * | 6/1992 | Sugino | 118/719 |
| 5,443,892 A | * | 8/1995 | Holcombe et al. | 428/212 |
| 5,498,442 A | * | 3/1996 | Lennartz | 427/6 |
| 5,614,447 A | * | 3/1997 | Yamaga et al. | 148/DIG. 113 |
| 5,685,906 A | * | 11/1997 | Dietze et al. | 117/101 |
| 5,886,863 A | * | 3/1999 | Nagasaki et al. | 279/128 |
| 5,985,024 A | * | 11/1999 | Balakrishna et al. | 117/104 |

FOREIGN PATENT DOCUMENTS

| | | | |
|---|---|---|---|
| DE | 28 26 943 | 2/1980 | |
| DE | 31 14 467 A1 | 10/1982 | |
| DE | 38 37 584 A1 | 5/1989 | |
| JP | 61251021 A | * 11/1986 | ......... H01L/21/205 |
| JP | 02248393 A | * 10/1990 | ........... C30B/25/12 |

* cited by examiner

*Primary Examiner*—Gregory Mills
*Assistant Examiner*—Ram N Kackar
(74) *Attorney, Agent, or Firm*—Laurence A. Greenberg; Werner H. Stemer; Ralph E. Locher

(57) ABSTRACT

A device for mounting a substrate includes a susceptor as a support for the substrate to be coated. The susceptor includes an insert whose surface is at least partly formed by a metal carbide layer of a predetermined thickness. The device for mounting the substrate eliminates a contamination of the substrate during processing, such as during production of an epitaxial layer on a wafer. A method for producing the insert includes the steps of producing a metallic preform, embedding the metallic preform in a carbon-containing powder, heating the metallic preform and the carbon-containing powder to an elevated temperature, hard processing the heat-treated preform and disposing the hard-processed preform on the susceptor as an insert.

13 Claims, 3 Drawing Sheets

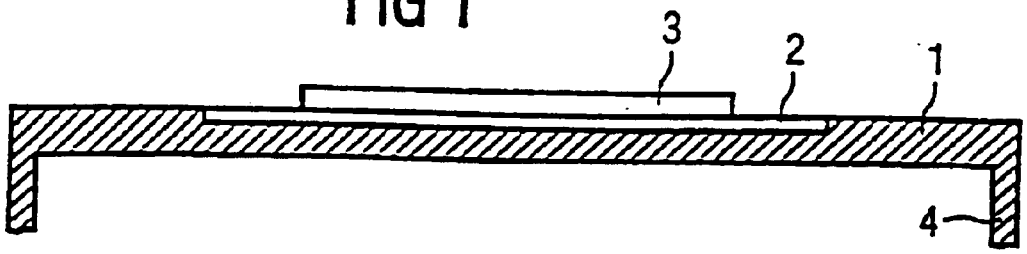
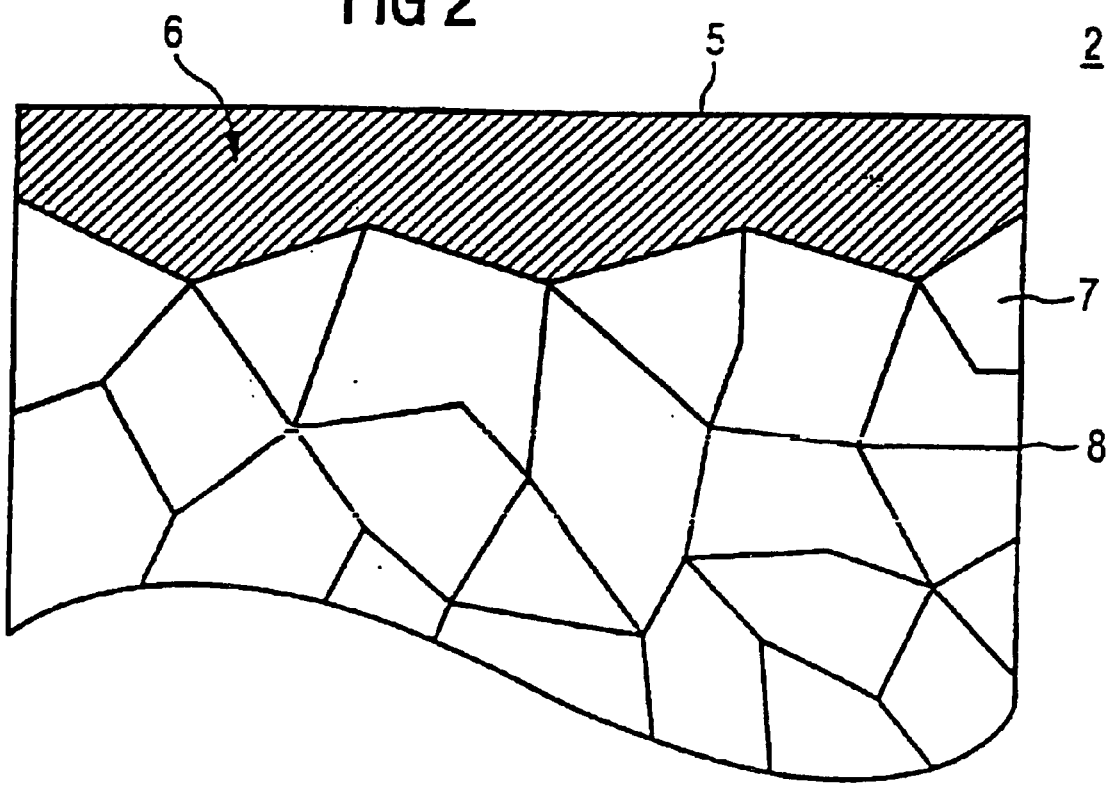

DEVICE FOR MOUNTING A SUBSTRATE AND METHOD FOR PRODUCING AN INSERT FOR A SUSCEPTOR

CROSS-REFERENCE TO RELATED APPLICATION

This application is a continuation of copending International Application No. PCT/DE99/00097, filed Jan. 18, 1999, which designated the United States.

BACKGROUND OF THE INVENTION

Field of the Invention

The invention relates to a device for mounting a substrate to be coated. The device includes a susceptor as a support for the substrate to be coated. The invention further relates to a method for producing an insert for such a susceptor.

The growth of a monocrystalline layer takes place at a much higher temperature in the case of silicon carbide than in the case of other semiconductors such as silicon or gallium arsenide. A primary problem in the field of silicon carbide epitaxy is therefore the choice of a suitable material as support and fixing device of the SiC wafer. The reason for this is, on the one hand, the high process temperature of between 1300° C. and 2000° C. and, on the other hand, the necessity of maintaining a hydrogen partial pressure in the process chamber of about 10 kPa (0.1 atm), in order to enable monocrystalline growth with acceptable growth rates (>1 $\mu$m/h). Moreover, it is necessary to prevent the material which is in direct contact with the SiC substrate from reacting with the substrate.

On account of these requirements, coated and uncoated graphite and also materials made of transition metals are materials used in the prior art.

Published, Non-Prosecuted German Patent Application DE 38 37 584 A1 discloses a coated substrate mount. In this case, an SiC layer is applied to the surface of a carbon base material.

Uncoated graphite is dimensionally stable and chemically completely inert with respect to SiC. Even with very high temperature gradients, cracking due to thermal stresses does not occur.

At the aforementioned high process temperature of 1300 to 1600° C. and a hydrogen partial pressure of about 10 kPa, however, a reaction occurs with the hydrogen to form hydrocarbons. Even if the removal rates are of the order of magnitude of 1 $\mu$m/h, these hydrocarbons shift the ratio of carbon to silicon, the ratio being predetermined by the process gases used, such as e.g. silane or propane, in the region of the substrate surface toward an excess of carbon. This effect is location-dependent and produces inhomogeneities in the substrate. Moreover, impurities contained in the graphite are released (Al, Ti, B) and incorporated into the epitaxial layer. The properties of this layer are adversely affected as a consequence.

In order to remedy this, in recent years increasing use has been made of graphite parts for mounting the wafer, that are coated with silicon carbide (SiC). A reaction between the hydrogen and the graphite can be prevented by making this coating gas-tight.

On the other hand, the coating causes the mechanical properties of the parts being adversely affected to a considerable extent. Temperature gradients in the mechanical parts can lead to cracks in the coating and even to a fracture of the entire part. Even non-continuous or non-penetrating cracks lead to an uncontrollable influence on the temperature distribution in the case of the inductive heating which is usually used.

Furthermore, there is the problem of undesired growth of SiC occurring due to the contact between the wafer and a surface, coated with SiC. This problem is intensified by the high process temperatures. The transport process takes place in particular from the support to the rear side of the wafer.

The literature likewise discloses the use of transition metals such as Mo and Ta as susceptor for SiC epitaxy. Both transition metals have a low vapor pressure and are not attacked by the hydrogen. Like graphite, these metals endure high thermal stresses.

However, the diffusion constants of impurities in these metals are high, with the result that e.g. Al contained in the transition metals can, due to this process, pass into the process atmosphere and adversely affect the properties of the epitaxial layer. Moreover, both metals form suicides and carbides, and thus a reaction occurs with the rear side of the wafer and/or with the cleavage products of the silane and propane. As a result, the optical properties of the material surface change in a time-dependent manner. Since a substantial part of the heat transport at the high process temperatures takes place via radiation, this once again results in undesirable perturbations of the temperature distribution of the wafer support. Moreover, Ta tends to include hydrogen in its crystal lattice at high temperatures, which leads to the destruction of the workpiece during a rapid cooling-down process. Therefore, the cooling-down process usually has to be halted for approximately 1 h at about 1000° C. and the H atmosphere has to be exchanged e.g. for Ar. This leads to an undesirable lengthening of the whole process and to higher costs.

SUMMARY OF THE INVENTION

It is accordingly an object of the invention to provide a device for mounting a substrate which overcomes the above-mentioned disadvantages of the heretofore-known devices of this general type and which rules out a contamination of the substrate during processing, e.g. during production of an epitaxial layer on a wafer. It is a further object of the invention to provide a method for producing an insert for a susceptor.

With the foregoing and other objects in view there is provided, in accordance with the invention, a device for mounting a substrate to be coated, including:

a susceptor for supporting a substrate;

the susceptor including an insert, which has a surface; and a metal carbide layer of a given thickness forming at least a portion of the surface.

The invention is based on replacing at least parts of the auxiliary materials which are in the high-temperature region during the SiC epitaxy process by metal carbides. To that end, it is proposed to seal the surface of the parts which come into contact with the SiC substrate under the aforementioned ambient conditions, that is to say to coat the surface in a gas-tight manner, with the result that no contaminating material from the parts can be incorporated or diffuse into the substrate via the surface. In this case, high temperature stable carbides should be chosen which are both inert with respect to hydrogen and are in chemical equilibrium with respect to SiC. Furthermore, the carbide-forming agent must not be an electrically active impurity in the SiC. In other words, substances such as Al and boron carbides are therefore ruled out. The following substances are particularly suitable: TaC, MoC, NbC, WC.

The device according to the invention for mounting a substrate, includes a susceptor as a support for the substrate to be coated. The susceptor includes an insert, whose surface is at least partly covered with a metal carbide layer of a predetermined thickness.

The insert is preferably constructed in such a way that it has a "sandwich" structure in its cross section, that is to say it includes a core, preferably made of graphite or a metal, which is covered with the metal carbide layer.

The thickness of the metal carbide layer on the insert may decrease with an increasing distance from the substrate. The substrate may for example be a wafer. As a result, mainly the surface in direct proximity to the substrate or wafer is sealed, so that there is no diffusion of contaminating material to the wafer from parts which directly come into contact with the wafer. As a result, the production costs of the corresponding parts which come into contact with the wafer are also reduced.

The metal carbide layer is preferably composed of TaC, MoC, NbC or WC.

The insert may include a plurality of tiles each for one substrate, in which case, furthermore, each tile may have a depression for a substrate.

With the objects of the invention in view there is also provided, a method for producing an insert for a susceptor, which includes the steps:

producing a metallic preform;

bedding the metallic preform in a carbon-containing powder;

heating the metallic preform and the carbon-containing powder to an elevated temperature for providing a heat-treated preform;

hard processing the heat-treated preform for providing a hard-processed preform having a surface layer made of a metal carbide; and disposing the hard-processed preform as an insert on a susceptor.

The method according to the invention for producing inserts with a surface layer made of metal carbides is based on the heat treatment or tempering of a preform embedded in SiC powder between 1500° C. and 2000° C. and the subsequent hard processing or machining to provide a final shape. This process produces a composite material including a carbide surface layer of greater or lesser thickness, depending on the heat-treatment conditions, and metal that is uncarburized or uncarbided in the interior. The grain boundaries in this metal are likewise at least partly carburized or carbided in this case.

The method for producing an insert for a susceptor with a surface layer made of metal carbide includes the steps of producing a metallic preform, embedding the metallic preform in a carbon-containing powder, heating the metallic preform and the carbon-containing powder to an elevated temperature, hard processing the heat-treated preform and disposing the hard-processed preform on the susceptor as an insert.

The elevated temperature in the heating step is preferably, between 1500° C. and 2000° C. The heating is preferably performed under elevated pressure.

The carbon-containing powder includes, in particular, silicon carbide powder.

The invention has the following advantages. There is no reaction between the substrate or wafer environment and the SiC and also the epitaxy process gas, such as e.g. propane, silane and hydrogen.

As a result, the purity of the epitaxial layer is improved and a longer service life of the workpiece is achieved. The mechanical properties of the substrate mounting components are good since carbides are intrinsically brittle, but the overall form is stabilized by the ductile metallic core, thus enabling greater flexibility in the configuration of susceptor, sample holder, etc. Moreover, the diffusion in the carbides with respect to the metals is greatly reduced. In particular, the grain boundaries in the metallic microstructure act as "diffusion brakes". Improved purity of the epitaxial layer is thus achieved. Finally, the inclusion of hydrogen in the crystal lattice is prevented, thereby enabling efficient process control.

Other features which are considered as characteristic for the invention are set forth in the appended claims.

Although the invention is illustrated and described herein as embodied in a substrate mount for SiC epitaxy and a method for producing an insert for a susceptor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic cross-sectional view of an embodiment of the graphite susceptor according to the invention with a carbide insert;

FIG. 2 is a diagrammatic, partial cross-sectional view of the microstructure of an insert for the graphite susceptor according to FIG. 1, the insert having been produced by the method according to the invention;

DESCRIPTION OF THE PREFERRED EMBODIMENTS

Figure 3:
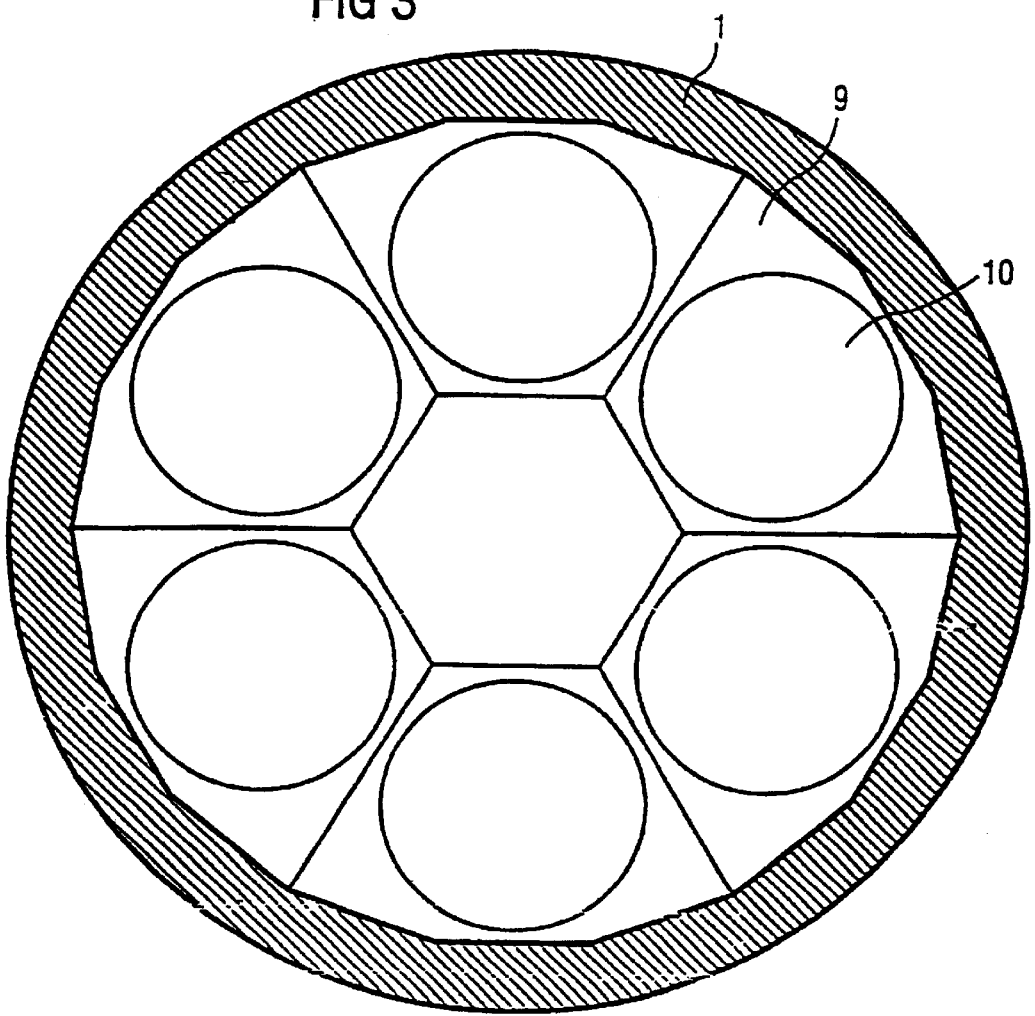
FIG. 3 is a diagrammatic plan view of an embodiment of the insert according to the invention for a multi-wafer epitaxy installation.

Referring now to the figures of the drawings in detail and first, particularly, to FIG. 1 thereof, there is shown a cross section through a preferred embodiment of the susceptor 1 according to the invention. The susceptor 1 is preferably produced from graphite so that the susceptor has an optimum thermal conductivity and the corresponding optimum electrical properties for an induction heating, for example with eddy currents. The exact form of the susceptor 1 can be adapted to the furnace without limitation by the invention. Thus, the susceptor 1 can have extensions 4, which serve as a frame for fixing or mounting the susceptor in a furnace, which is not illustrated. The extensions 4 on the side of the susceptor 1 in FIG. 1 may be composed of the same material as the susceptor 1 and be connected integrally to the latter, or may be formed from a different material and be connected to the susceptor 1 in a positively locking or interlocking manner.

On a top side, the susceptor 1 has, according to the invention, a depression for an insert 2. This depression serves for accommodating one or more tiles or inserts 2, on each of which a wafer or a substrate 3 made of a semiconductor material is situated. In particular, but not exclusively, as already explained above, the device for mounting a substrate is suitable for semiconductor materials which have to be processed at very high temperatures, such as SiC, etc.

The processing of the substrate made of SiC may include e.g. the epitaxial growth of SiC on the substrate.

On the one hand, the insert 2 in the susceptor 1 according to the invention must withstand a very high temperature stress and, on the other hand, its properties must not be impaired by the H-atmosphere. According to the invention, the insert 2 is therefore composed of a temperature stable carbide which is inert with respect to hydrogen and is in chemical equilibrium with SiC. To ensure that no impurity is introduced into the silicon carbide by the cation in the carbide, a number of metals are ruled out as carbide cations, in particular Al and B, which could otherwise diffuse into the SiC or be incorporated into the epitaxial layer and act as acceptors. Tantalum, molybdenum, niobium, tungsten and further transition group elements such as Cr, Hf, V etc., are therefore preferably used as cations of the carbide.

In a preferred embodiment of the invention, the insert 2 is a produced by sintering or heat treating a mixture including metal powder and carbon. Under pressure and at high temperature, carburization occurs in the powder mixture. A cross section through the composite material thus obtained is shown as a part of the insert 2 in FIG. 2. The surface 5 of the insert 2 is essentially formed by carbide 6, while deeper in the insert 2, the metal is present in the form of metallic structural grains 7. The metallic grains 7 each have a grain boundary 8 at which the metal is likewise at least partly carburized or carbidized.

Figure 4:
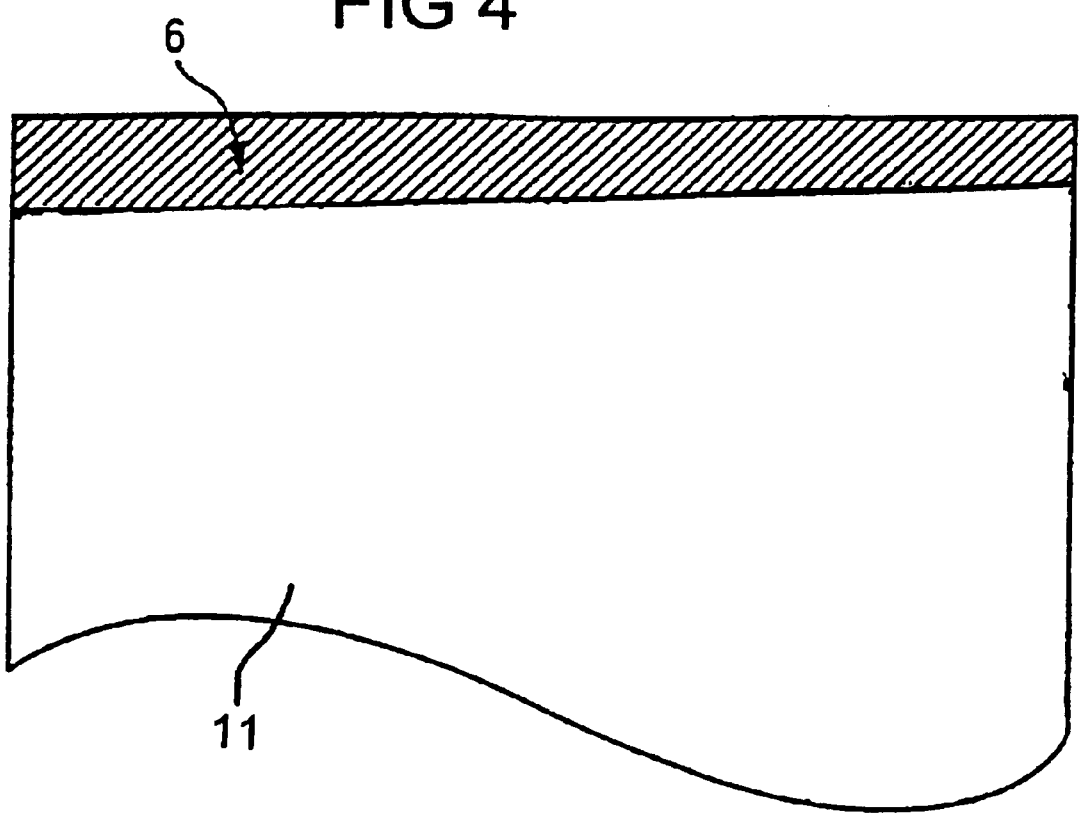
FIG. 4 is a diagrammatic, partial cross-sectional view of a further embodiment of an insert for the graphite susceptor according to FIG. 1.

In another preferred embodiment of the invention, a "sandwich" structure is used as the insert, in which the surface is a layer made of metal carbide which is applied using a different technique from the one described in the paragraph above (e.g. vapor phase deposition, etc.), and in which the core of the insert 2 is a graphite body or a metal body. This embodiment has the advantage that the shaping of the insert 2 is simpler than in the above-mentioned production through the use of sintering or heat treatment of the entire insert. FIG. 4 is a diagrammatic, partial cross-sectional view of such an insert 2 having a core 11 formed of a graphite body or a metal body covered by a metal carbide layer 6. The thickness of the layer may vary, preferably such that it decreases in a direction away from the wafer.

In particular, in the case of the last-mentioned structure, the thickness of the layer made of metal carbide can be set particularly simply, with the result that in particular the parts in direct proximity to the wafer are sealed. Appropriate materials for the core of the insert 2 are once again a variety of materials such as e.g. graphite, metals such as Mo, W, Hf, etc., and further composite materials which withstand the requirements with regard to temperature and chemical stress.

The method according to the invention for producing a susceptor with a surface layer made of metal carbide is based on the heat treatment such as tempering or sintering of a preform embedded in SiC powder, preferably at a temperature of between 1500° C. and 2000° C., and the subsequent hard processing or machining for the final shaping. This process produces a composite material which includes a carbide surface layer of greater or lesser thickness, depending on the heat-treatment conditions, and metal that has remained uncarburized in the interior.

FIG. 3 shows an embodiment of an insert according to the invention in its overall size. The susceptor 1 is illustrated in the outer area. The insert 2 is composed of a plurality of tiles 9 which all essentially have a form such that there is space on them for a wafer 3 (not illustrated in FIG. 3). The illustrated embodiment of the insert 2 is configured for six wafers. The susceptor 1 is rotated about an axis which runs through the center of the susceptor 1 in FIG. 3 and perpendicularly to the plane of the drawing. The rotation can take place at a relatively high speed, depending on the processing step of the wafers 3, inter alia in order to ensure a stable gas stream in the chamber or the furnace during processing. In order that the wafers 3 maintain a defined distance from one another and do not slip during the rotation, a depression 10 whose diameter corresponds to the diameter of a wafer is provided in each tile 9. The insert 2 illustrated in FIG. 3 is thus particularly suitable for a multi-wafer epitaxy system or facility.

A further advantage of the embodiment according to FIG. 3 is that it is possible to create defined ambient conditions for the wafers. This is because a combination of the carbides with graphite or else metals such as Ta, Mo, W in the overall structure is desirable in particular in the hot zone of an epitaxy reactor, and is possible in chemical equilibrium. Since in particular the direct surroundings of the wafer are critical for the entry of impurities, the carbides are preferably used there. The depression 10 in the tiles 9 can thus prevent the wafer 3 from slipping and reaching a point where fewer carbides are present. Thus a contamination of the wafer can be prevented.

We claim:

1. A device for mounting a substrate to be coated in a gaseous atmosphere, comprising:

a susceptor for supporting a substrate to be coated in the gaseous atmosphere;

said susceptor including an insert having a surface and including a graphite core; and a metal carbide layer of a given thickness covering said graphite core, said metal carbide layer including one carbide selected from the group consisting of tantalum carbide, niobium carbide, tungsten carbide, molybdenum carbide, chromium carbide, vanadium carbide and hafnium carbide and forming at least a portion of said surface, said portion supporting the substrate.

2. The device according to claim 1, wherein said insert includes a plurality of tiles, each of said tiles being provided for a respective substrate.

3. The device according to claim 2, wherein each of said tiles is formed with a depression for the respective substrate.

4. The device according to claim 1, wherein said portion of said surface of said metal carbide layer is in direct proximity to the substrate, when the substrate is mounted thereon, for preventing contaminating material from diffusing into the substrate through said portion of said surface.

5. The device according to claim 1, wherein said substrate is to be silicon carbide coated.

6. The device according to claim 1, wherein said substrate includes silicon carbide.

7. The device according to claim 1, wherein said gaseous atmosphere contains hydrogen.

8. A device according to claim 1 for mounting a substrate including silicon carbide and to be coated in a hydrogen containing gaseous atmosphere, comprising:

a susceptor for supporting a substrate to be coated in the hydrogen containing gaseous atmosphere;

said susceptor including a graphite core insert having a surface; and a metal carbide layer of a given thickness forming at least a portion of said surface, said portion supporting the substrate, said metal carbide layer being inert with respect to the hydrogen of the gaseous atmosphere.

9. The device according to claim 8, wherein said insert includes a plurality of tiles, each of said tiles being provided for a respective substrate.

10. The device according to claim 9, wherein each of said tiles is formed with a depression for the respective substrate.

11. The device according to claim 8, wherein said insert includes a graphite core, said metal carbide layer covers said graphite core.

12. The device according to claim 8, wherein said metal carbide layer includes one carbide selected from the group consisting of tantalum carbide, niobium carbide, tungsten carbide, molybdenum carbide, chromium carbide, vanadium carbide and hafnium carbide.

13. The device according to claim 8, wherein said portion of said surface of said metal carbide layer is in direct proximity to the substrate, when the substrate is mounted thereon, for preventing contaminating material from diffusing into the substrate through said portion of said surface.

* * * * *